(12) United States Patent
Clevenger et al.

(10) Patent No.: US 6,964,892 B2
(45) Date of Patent: Nov. 15, 2005

(54) N-CHANNEL METAL OXIDE SEMICONDUCTOR (NMOS) DRIVER CIRCUIT AND METHOD OF MAKING SAME

(75) Inventors: Lawrence A. Clevenger, LaGrangeville, NY (US); Rama Divakaruni, Somers, NY (US); Louis Lu-Chen Hsu, Fishkill, NY (US); Yujun Li, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 10/155,731

(22) Filed: May 28, 2002

(65) Prior Publication Data

US 2002/0149063 A1 Oct. 17, 2002

Related U.S. Application Data

(62) Division of application No. 09/488,515, filed on Jan. 21, 2000, now Pat. No. 6,433,397.

(51) Int. Cl.[7] ............... H01L 21/8238; H01L 21/00; H01L 21/84
(52) U.S. Cl. ............... 438/199; 438/153; 438/969
(58) Field of Search ............... 438/199, 153, 438/210, 238, 241, 969, 621

(56) References Cited

U.S. PATENT DOCUMENTS

| 4,755,864 A |   | 7/1988 | Ariizumi |
|---|---|---|---|
| 5,045,901 A |   | 9/1991 | Komori et al. |
| 5,276,344 A |   | 1/1994 | Arima et al. |
| 5,945,698 A |   | 8/1999 | Prall |
| 6,140,684 A | * | 10/2000 | Chan et al. ............ 438/199 |
| 6,177,289 B1 |   | 1/2001 | Crow et al. |
| 6,258,679 B1 |   | 7/2001 | Burns et al. |
| 6,433,397 B1 | * | 8/2002 | Clevenger et al. ........ 257/382 |

FOREIGN PATENT DOCUMENTS

| JP | 04-249327 | 9/1992 |
|---|---|---|
| JP | 10-50957 | 2/1998 |

OTHER PUBLICATIONS

Nakamura, et al., "A 29–ns– 64–Mb DRAM with Hierarchical Array Architecture", IEEE Journal of Solid–State Circuits, vol. 31, No. 9, Sep. 1996, pp. 1302–1307.

* cited by examiner

*Primary Examiner*—John F. Niebling
*Assistant Examiner*—Walter L. Lindsay, Jr.
(74) *Attorney, Agent, or Firm*—Wan Yee Cheung, Esq.; McGinn & Gibb, PLLC

(57) ABSTRACT

An N-channel metal oxide semiconductor (NMOS) driver circuit (and method for making the same), includes a boost gate stack formed on a substrate and having a source and drain formed by a low concentration implantation, and an N-driver coupled to the boost gate stack.

25 Claims, 6 Drawing Sheets

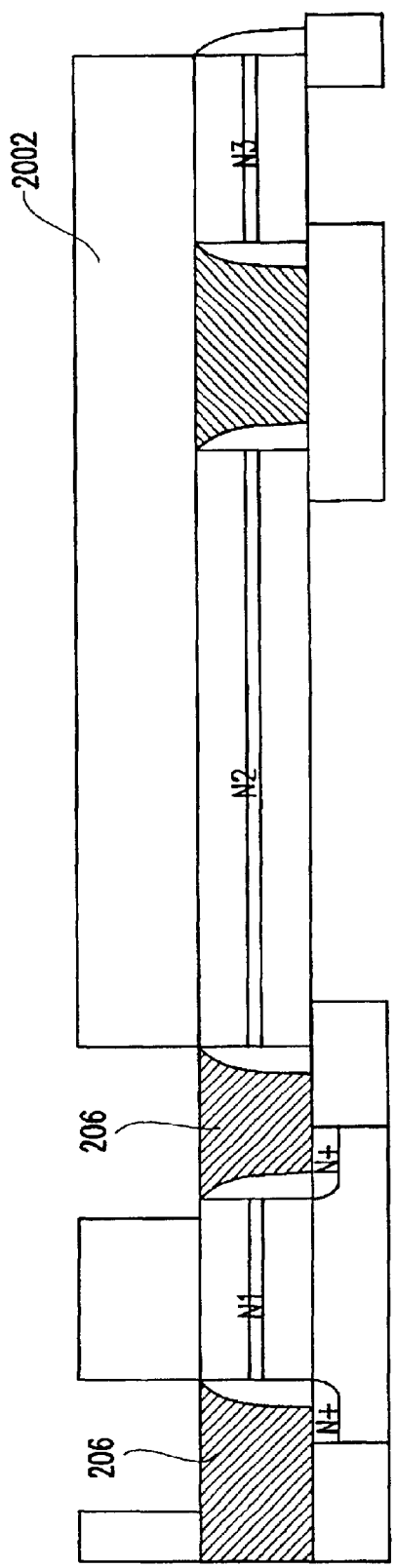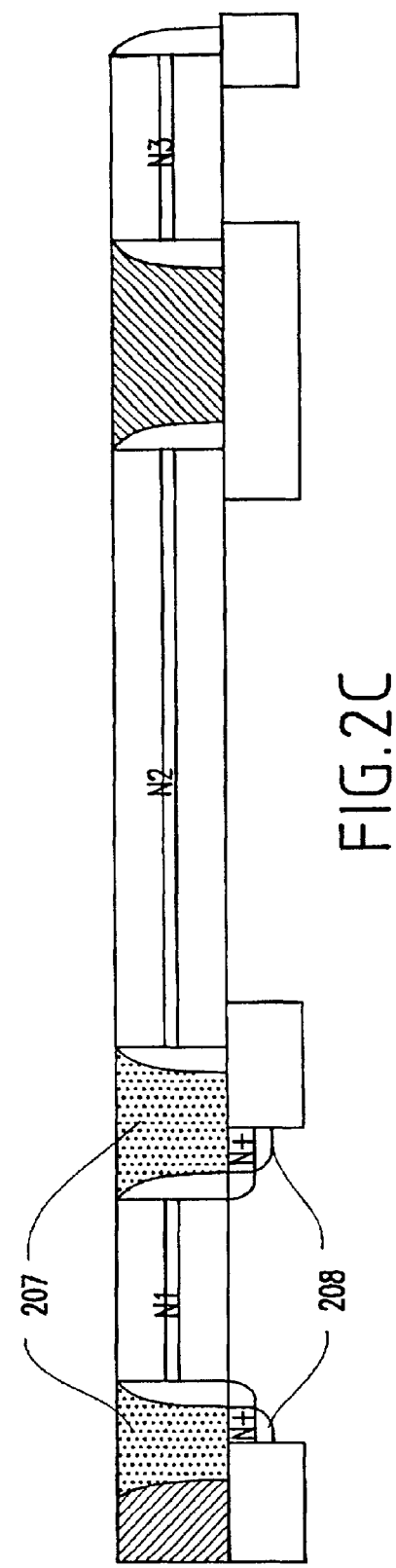
FIG.2B
FIG.2C

N-CHANNEL METAL OXIDE SEMICONDUCTOR (NMOS) DRIVER CIRCUIT AND METHOD OF MAKING SAME

The present Application is a Divisional Application of U.S. patent application No. 09/488,515, filed on Jan. 21, 2000, now U.S. Pat. No. 6,433,397.

BACKGROUND OF THE INVENTION

1. Field of the Invention

The present invention generally relates to an NMOS driver circuit, and a method of fabricating an NMOS driver circuit with improved performance and reliability.

2. Description of the Related Art

An N-channel metal oxide semiconductor (NMOS) driver is known to have certain advantages as compared to conventional complementary oxide semiconductor (CMOS) drivers (e.g., such as P-channel field effect transistors (PFETs), N-channel field effect transistors (NFETs) and the like), such as smaller area, a switching performance gain, and less gate oxide stress.

The NMOS driver has a smaller area compared to a CMOS driver based on similar performance. Such a smaller area results from the CMOS device (e.g., PFETs, NFETs, etc.) having a design width which is double that of the NFET device because of a difference in hole and electron mobility. The mobility of electrons, which are the conducting carriers for NFETs, is about two times that of holes, which are the conducting carriers for PFETs. In order to switch a driver with similar rise and fall times, the width of a PFET device must be two times that of an NFET device.

Further, to reduce the cost of a typical dynamic random access memory (DRAM) circuit, single-workfunction gate materials (e.g., $N^+$ polysilicon gate for both NFETS and PFETs) are used instead of dual-workfunction gate materials (e.g., N+ polysilicon for NFET and P+ polysilicon for PFET). Since a dual-workfunction-gate process requires extra mask steps and extra implant steps, it is generally more expensive than a single-work function-gate process. However, when the single-work function-gate process is used (e.g., N+ polysilicon gate only), the PFETs typically are buried channel PFETs, which have a substantially worse short-channel effect as compared with surface channel PFETs, or NFETs. For purposes of the present invention, the "short channel effect" is defined as the drop in device threshold voltage for a short-channel transistor when compared with that of a long-channel transistor. When the threshold voltage is below the designed target, excessive leakage current may occur even when the gate should supposedly be "OFF".

Buried channel PFETs also tend to be more susceptible to the "punchthrough effect". "Punchthrough" happens when the depletion region from the source and drain region of the transistor merge due to a high voltage applied on the drain terminal of the transistor. When punchthrough occurs, the drain current will no longer be controlled by the gate voltage. The loss of gate control can lead to circuit malfunction.

In order to avoid short channel effect and punchthrough effect in a buried channel PFET, the channel length of the nominal PFET used in the circuit is typically designed longer than that of NFET. This not only leads to circuit area penalty, but also to performance degradation.

Further, the size of a conventional CMOS driver is larger than that of an NMOS driver also because there is a minimum distance required between PFET and NFET devices for the conventional CMOS process. Good isolation between PFET and NFET requires optimum well design and latch up immunity. For example, a range of a typical distance between the PFET and NFET devices is about 150 nm to about 175 nm (e.g., the design rule or ground rule which is typically device-dependent and depends on the substrate's dopant level). The exclusive use of NFETs in the word line (WL) driver area reduces the circuit area by eliminating this minimum distance requirement since only p-wells exists.

Further, the conventional devices (CMOS devices such as PFETs and the like) require a killer switch for disabling wordline drivers that are activated but not selected by the row address. Since each one wordline is selected, any other wordlines that are activated must be disabled. For an NMOS wordline driver, however, no killer switch device is required since the charge on the non-selected wordlines can be discharged to ground via a pull-up or pull-down device. The size of the NMOS wordline driver circuit can therefore be further reduced.

For all of the reasons discussed above, a size reduction in chip area of about 1% for a 1 Gb DRAM can be obtained by using NMOS instead of CMOS in all wordline drivers.

Switching performance gains can also be realized by using NMOS drivers instead of CMOS drivers. The reasons are twofold: 1) electron mobility is higher than hole mobility. NFET devices operate faster than PFET devices, which leads to faster signal development during a data accessing operation; and 2) NFETs have far more superior turn-on (transient) characteristics than buried channel PFETs, since the subthreshold slope is degraded for buried channel PFETs. This is supported by circuit simulation. For example, as shown in FIG. 5, output waveforms are compared for the conventional CMOS wordline driver and the NMOS wordline driver. As shown, faster switching performance is demonstrated for the NMOS driver circuit.

Reliability of the NMOS drivers is greater than that of the conventional CMOS driver. One of the limitations for the highest boosted WL voltage Vpp is the reliability of the buried channel PFET used in the WL driver region. Due to the intrinsic work function difference between the gate and the drain, there is a built-in 1 V difference for the PFET gate and source/drain overlap region. Therefore, the off-state stress or the gate-induced drain leakage (GIDL) stress is much worse for the buried channel PFET than for the surface channel PFET, or NFET. The off-state stress occurs when there is a high field between the gate and the drain region. This high field can lead to impact ionization of either holes or electrons. Carriers with high enough energy can overcome the barrier at the gate oxide interface, travel towards the gate oxide, and cause permanent damage to the gate oxide interface. The additional 1V built-in potential at the gate and drain overlap region for buried channel PFET implies that the reliability of buried channel PFET is less superior than that of its surface channel counterpart or that of NFETs.

Further advantages of the NMOS driver over the CMOS driver are that less gate oxide stress occurs, and that the NMOS is more suited for negative WL low applications.

There have been attempts in the conventional methods and structures to implement an NMOS driver to resolve the problems inherent in using a CMOS driver. However, the NMOS driver devices also have some drawbacks.

For example, in a conventional NMOS driver as shown in FIG. 1B and as proposed by M. Nakamura, et al. ("A 20 Ns, 64M DRAM with Hierarchical Array Architecture", *IEEE J.* of *SSC*, Vo. 32, No. 9, September 1996, p.1302), serious reliability problems develop related to junction breakdown on a boosted node, especially during a bum-in condition when a much higher voltage is applied (e.g., typically 1.5× that of the nominal operating voltage).

In the conventional technology (e.g., typical CMOS technology), the junction of the support devices can only sustain a voltage of up to 7V. Typically, during bum-in, the reverse bias voltage across the boost node junction is greater than 7V. As a result, damage may occur to the junction. That is, the reverse bias voltage may lead to junction breakdown and high leakage current between the junction and the substrate. In the conventional NMOS driver, this condition can result in permanent damage to the boost device, or at a minimum high junction leakage.

The consequence of such damage or leakage is that the boosted node voltage of the NMOS driver can no longer be sustained during wordline operation. This limitation is a main reason why an NMOS driver is not utilized in today's high performance and high density memory design.

SUMMARY OF THE INVENTION

In view of the foregoing problems, drawbacks, and disadvantages of the conventional structures and methods, it is an object of the present invention to provide a structure and method for fabrication which solves the junction breakdown problem found in conventional NMOS drivers.

It is a further object to produce a driver, and particularly an NMOS driver, that has a smaller area, with equal or better performance to that of the conventional NMOS driver, with improved reliability.

Additionally, it is an object of the present invention to arrange the most cost-effective physical layout of the driver circuit so that the boost node can be formed by using an array process to improve boost node reliability.

It is an object of the present invention to provide for a structure more suitable for negative WL low application.

Yet another object of the present invention is to provide improved reliability by increasing junction breakdown voltage of the boost node of the NMOS driver from 7V to more than 10 V.

In a first aspect of the present invention, an N-channel metal oxide semiconductor (NMOS) driver circuit, includes a boost gate stack formed on a substrate and having a source and drain formed by a low concentration implantation, and an N-driver coupled to the boost gate stack.

In a second aspect of the invention, a method of forming an N-channel metal oxide semiconductor (NMOS) driver circuit, includes forming a gate stack on a substrate, using a DRAM array implant to form a source and drain of the NMOS boost transfer gate, thereby to improve reliability of the driver circuit, and forming contacts adjacent the gate stack.

In yet another aspect, the inventive method includes forming a shallow trench isolation (STI), a gate including sidewall spacers, implanting the boost devices with a low concentration dopant (e.g., an array junction implantation typically using phosphorous having a concentration level of about $10^{14}$ to $10^{13}$ ions per $cm^3$ as compared to the source/drain implant of a peripheral device typically using arsenic having a concentration level of about the $10^{15}$ ions per $cm^3$ range), annealing the source (S) and drain (D) of the boost devices, depositing a layer of dielectric thereover, planarizing the dielectric layer, patterning the contact with a specially designed mask, depositing a layer of doped polysilicon, planarizing the layer of doped polysilicon to form the studs in an identical way as forming bitline contacts in the array, annealing these bitline contacts, or so called CB contacts to drive-in the dopants and to further reduce the contact resistance, adding a second dielectric layer deposition, planarizing the second dielectric layer deposition, patterning the CS using the support device contact mask, forming a contact to connect a diffusion to the gate, and connecting the boost node of the N1 device to the gate of a pull-up N2 device of an NMOS driver.

The layer of dielectric, can be boron phosphorus silicate glass (BPSG). The CB is patterned using a specially designed CB mask. A layer of doped polysilicon can be used to form the CB studs, and an annealing is performed to drive in the dopants.

With the unique and unobvious features of the invention, the junction breakdown problem found in conventional NMOS drivers is overcome. Further, an NMOS driver is produced which has a smaller area, with similar or better performance to that of the conventional NMOS drivers, with improved reliability. Such improved reliability is made possible in part by increasing junction breakdown voltage of the boost node of the NMOS driver from 7V to more than 10V.

Moreover, less gate oxide stress results with the structure and method of the present invention. The inventive structure can be advantageously provided (and indeed is more suitable) for negative WL low application.

BRIEF DESCRIPTION OF THE DRAWINGS

The foregoing and other objects, aspects and advantages will be better understood from the following detailed description of a preferred embodiment of the invention with reference to the drawings, in which:

FIGS. 2A–2D illustrate a method of fabricating an NMOS driver circuit according to the present invention;

DETAILED DESCRIPTION OF PREFERRED EMBODIMENTS OF THE INVENTION

Figure 1A:
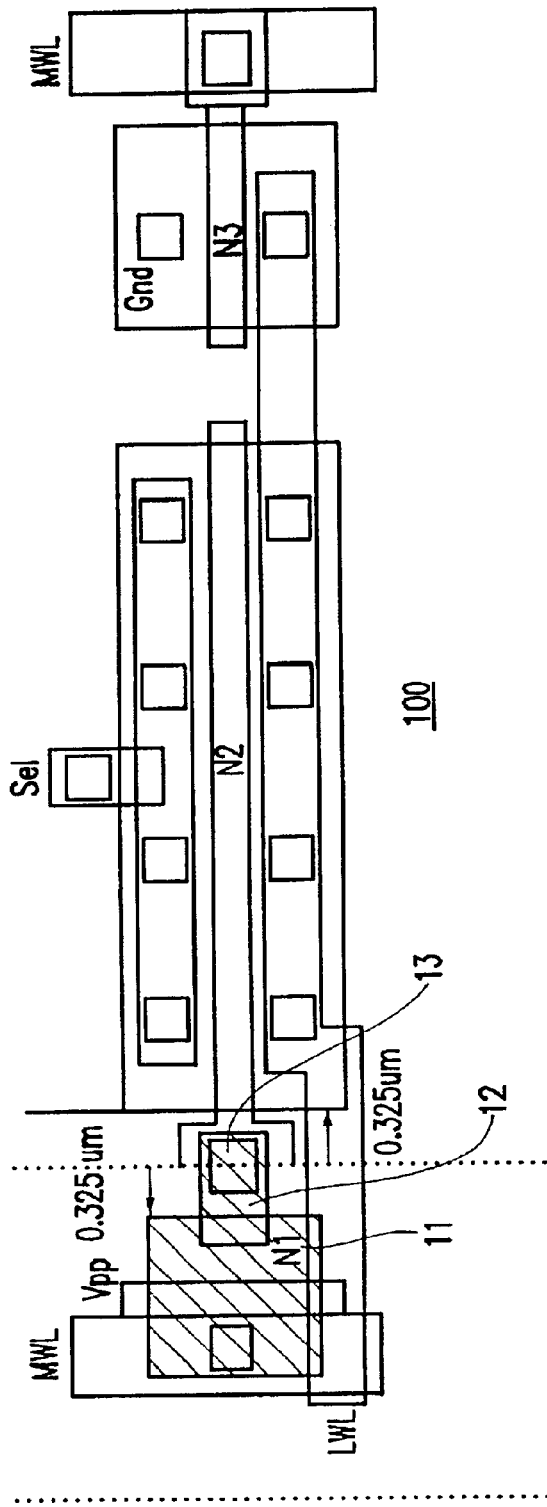
FIG. 1A is a layout diagram of an NMOS driver circuit according to the present invention.

Referring now to the drawings, and more particularly to FIGS. 2A–5, an embodiment of the present invention will be described.

In FIG. 1A, a top view of an NMOS driver circuit 100 is shown. The shape of a contact bitline (CB) mask, or the cross-hatched area, for a boost device 11 (e.g., N1) is shown in FIG. 1A. The CB mask is for forming contacts and for driving in more dopant.

As a result, the boost device 11 will have XA implant, or a lower concentration N-type array implant, 11A and its serial resistance is reduced by the self-aligned CB diffusion.

Arranging the device 11 close to the array allows it to be implanted by XA mask without increasing the support area, and thereby increases the density.

Through a CB extension 12, the CB contact 12 is formed in a self-aligned manner which abuts the gate of the pull-up NMOS device N2, as shown in FIG. 1A. The connection (e.g., joint) of the boost node to the gate is performed by a contact support (CS) 13, as shown in FIG. 1A.

A conventional structure will be described with reference to FIG. 1B, for purposes of comparison with the present invention.

Figure 1B:
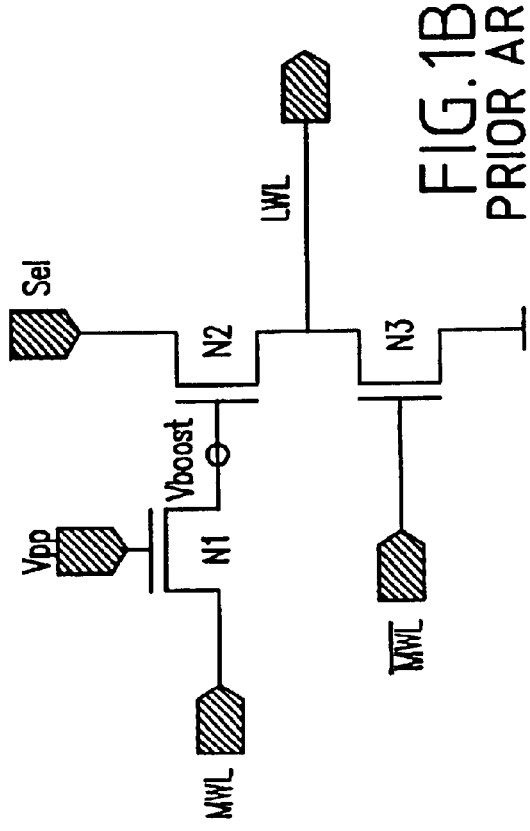
FIG. 1B is a schematic drawing of a conventional NMOS driver circuit.

Referring to FIG. 1B, which illustrates a circuit diagram of the conventional NMOS driver, regarding N1 which is an exemplary N-MOS boost device, during bum-in, the Vg, Vd and Vs of the N1 are at 4.45V, 7.1V and 4.45V, respectively. The device after being activated is not conducting.

A problem (and major consideration) during bum-in is the high reverse bias of the boost junction voltage. That is, the NMOS driver becomes useless (e.g., damaged or destroyed) if the high reverse bias of the boost junction voltage is not addressed. This is because, after the boost node's junction is damaged, it becomes leaky and can not hold the boost voltage any more. Implementing a solution, as in the invention described below and shown in FIGS. 2A–2D, to avoid junction break-down, makes the use of a NMOS driver very advantageous.

Furthermore, if the channel length of a device is too small, it will be susceptible to punch-through, as mentioned above.

Therefore, the channel length of this device should be longer than the minimum channel length (e.g., depending on the device formed and the ground/design rule employed). The time period which a boost voltage can be maintained depends on how isolated the node is. An approximation of the junction leakage current during a normal condition (e.g., no junction breakdown) is within the 100 fA/$\mu$m range. The subthreshold leakage is below 1.0 pA range. Maintaining the boost node to meet the specification of Tras=100 $\mu$s is no longer a problem having resolved the junction breakdown problem with the present invention, as described below.

Preferred Embodiment of the Incentive Process

As shown in FIGS. 2A–2D, a cross-sectional view illustrating the method for fabricating the NMOS driver circuit according to a preferred embodiment is shown. FIG. 2E illustrates a top view of the resulting product and is similar to what is shown in FIG. 1A.

Figure 2A:
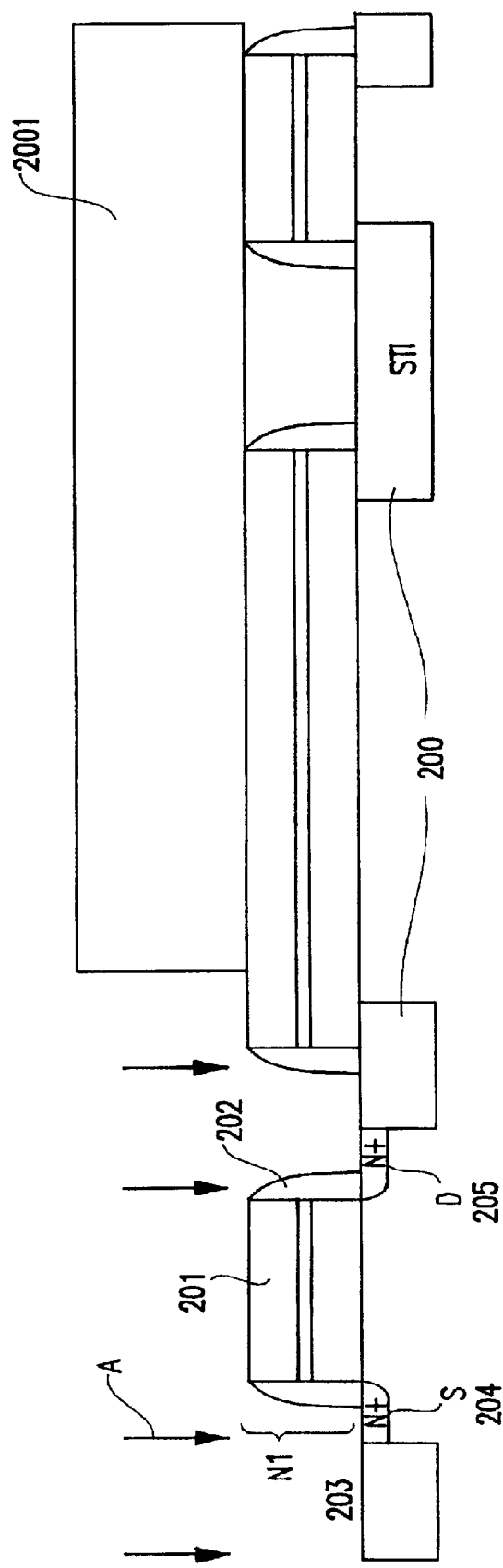

In FIG. 2A, a first step of the method of the invention is illustrated. First, a shallow trench isolation (STI) 200 is formed, along with a gate 201 including sidewall spacers 202. As shown the N1 boost device is formed on the lefthand side of FIG. 2A.

Then, XA-implanting the boost devices 203 is performed as shown by arrows A. The XA-implantation is typically performed using phosphorous or boron having a relatively low concentration level of about $1 \times 10^{13}$ dopant ions per cm$^3$ to about $1 \times 10^{14}$ dopant ions per cm$^3$. A photoresist 2001 is used in forming the N1 device and the n-type (e.g., n+) source 204 and drain 205 for the N1 device.

Thereafter, in FIG. 2B, the source (S) 204 and drain (D) 205 of the boost devices (e.g., N1) are annealed, and a layer of dielectric 206 (e.g., a glass such as boron phosphorous silicate glass (BPSG)) and is deposited thereover. The dielectric layer 206 is planarized by, for example, chemical-mechanical polishing (CMP). Other planarization methods also could be employed. In FIG. 2B, while not shown, a similar operation is performed to form an array device similar to the N1 device, but having a deep trench. A photoresist 2002, similar to that of photoresist 2001, is used in FIG. 2B for removing the glass.

In FIG. 2C, a contact bitline (CB) is then patterned with a specially designed mask, and a layer of doped polysilicon is formed (e.g., deposited) and planarized to form CB studs 207. The CB is annealed to drive-in the dopants (as shown at reference numeral 208 in FIG. 2C). As mentioned above, the dopant is typically phosphorus or boron. Thus, the source and drain dopants are driven deeper by the annealing of the polysilicon. This deepening of the dopants helps activate the dopant quicker, thereby to lower a breakdown voltage of the device.

As shown in FIG. 2C, the doped polysilicon 207 shown on the right-hand side of the boost node N1 (e.g., the doped polysilicon formed between N1 and N2) at this stage does not provide a connection between the contact and the N2 device yet.

Figure 2D:
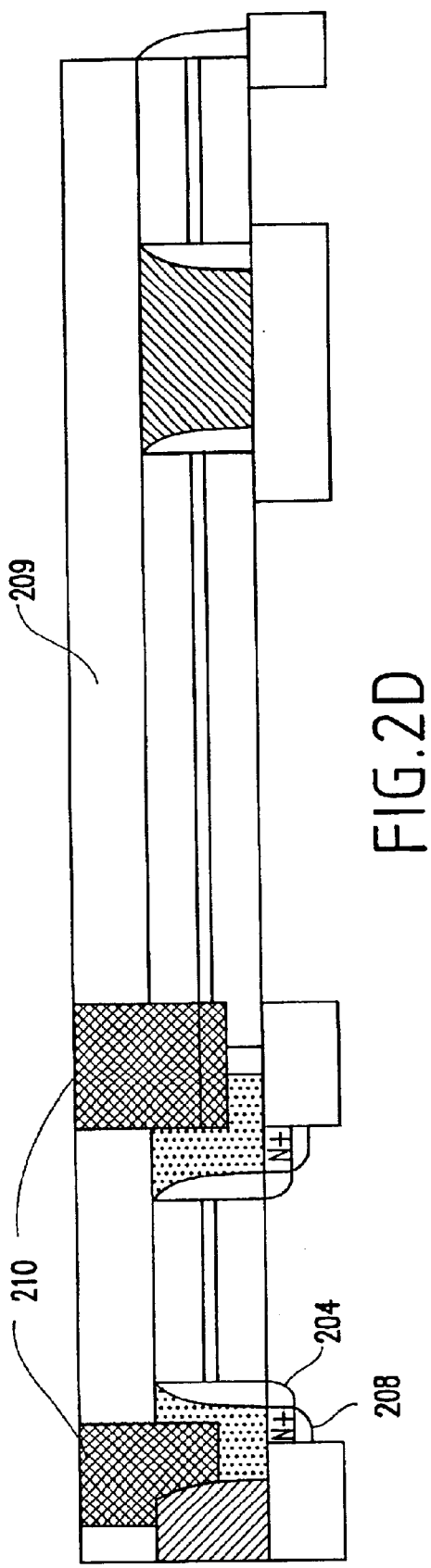
Figure 2E:
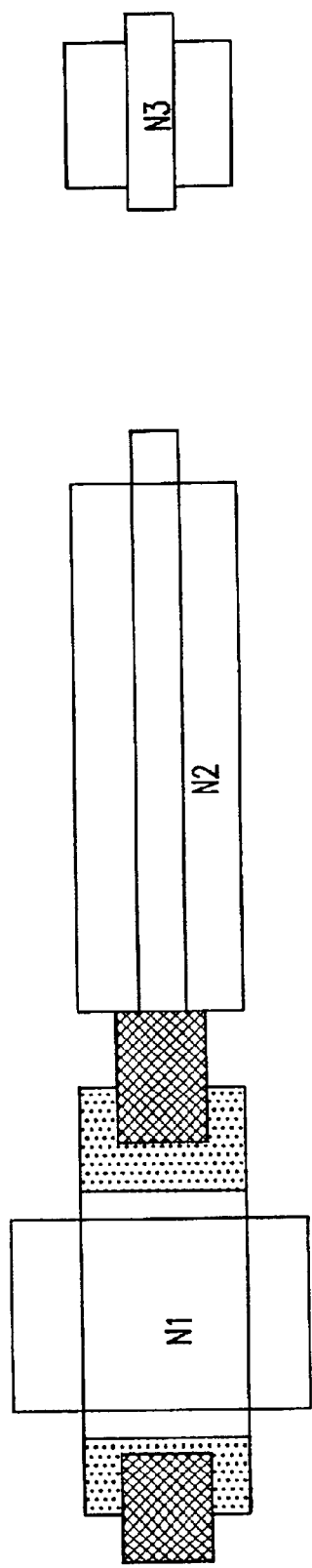
FIG. 2E illustrates a top view of the NMOS driver circuit formed in the method shown in FIGS. 2A–2D.

As shown in FIG. 2D, a second dielectric layer 209 is deposited, and the CB is patterned using another specially designed mask. Thereafter, CS (e.g., contacts for supporting device's gate, source and drain) contacts 210 are formed preferably from tungsten, etc., to reduce resistance, and the boost node of the N1 device is connected to a gate of the pull-up N2 device.

That is, the boost node N1 is connected to the N2 device via the tungsten contact 210. The tungsten 210 joins the N1 node to the polysilicon gate of N2.

It is noted that the layers of gate stack of FIGS. 2A–2D are shown as being conductive. Of course, non-conductive layers could also be used in combination with the conductive layers with suitable modification of the layer structure, as would be known by one of ordinary skill in the art taking the present application as a whole.

Thus, the reason why the invention is better than the conventional process is that the XA (lower concentration dopant level) is used in the present invention. That is, if a higher dopant level is used, then the array may have leakage. The array typically has a trench capacitor and if the dopant is too high, then leakage may result. In the invention, with the lower dopant level, leakage is minimized. By the same token, if the dopant level is too low, then the contact resistance may be too high. The invention overcomes this disadvantage by using doped polysilicon 207 (e.g., in FIG. 2C) to drive in the dopants (e.g., at 208) to decrease the contact resistance. This is done simutaneoulsy with array bit-line (or CB) contact process and therefore not extra cost is involved. Thus, the invention achieves lower dopant level and lower contact resistance, and the boost node can achieve much higher breakdown voltages (e.g., from 7V in the conventional process to approximately 10V in the inventive process). Hence, the NFET can be used with greater reliability as a driver.

Hence, the present invention provides a new process for reducing the junction stress and "junction punchthrough" phenomenon, thereby increasing reliability of the NMOS driver circuit and allowing wider usage of the NMOS driver circuit. That is, the invention recognizes that the boost node has very high voltage and is beyond the highest voltages which can be sustained under the conventional process. Thus, the invention must modify the boost node in some way to achieve the unexpectedly superior results of the invention. That is, the invention provides the boost driver of the driver adjacent (close) to the array and advantageously drives in the dopants and uses the array implantation without area penalty.

Specifically, the invention uses the array implant 11A (e.g., for the NFET array which is the DRAM transfer gate array) in forming the driver. For example, as described in further detail below with respect to FIG. 3, there are shown three rows of drivers (e.g., left, middle and right-hand side) adjacent to the two arrays. As shown, a portion (e.g., a triangular portion) is shown within the array boundaries. This triangular portion (e.g., part of the 11A region of FIG. 1) takes the array implant. As a result, the N1 device can be formed adjacent to the array and can take the array implant.

This inventive layout is in contrast to the conventional layout which typically places the N1 boost device anywhere (e.g., no particular place) in the circuit. The invention purposely, intentionally and affirmatively forms the N1 device adjacent to the array (FIG. 3) such that the XA implant can be extended to cover that region (e.g., where the boost device is formed) and such that the N1 device is built with a protective junction (e.g., the XA implant having the lower dopant concentration) formed thereover. Hence, the junction breakdown voltage of the boost device of the invention can be made higher than that in the conventional methods since the lower junction implant (XA) is used. Thus, a reliable boost node N1 can be formed without any extra processing steps or taking up any extra "chip real estate".

With the unique and unobvious features of the invention, the junction breakdown problem found in conventional NMOS drivers is overcome. Further, an NMOS driver is produced which has a smaller area, with similar performance to that of the conventional NMOS drivers, with improved reliability. Such improved reliability is made possible in part by increasing junction breakdown voltage of the boost node of the NMOS driver from 7V to more than 10V.

Moreover, less gate oxide stress results with the structure and method of the present invention. The inventive structure can be advantageously provided (and indeed is more suitable) for negative WL low application.

Figure 3:
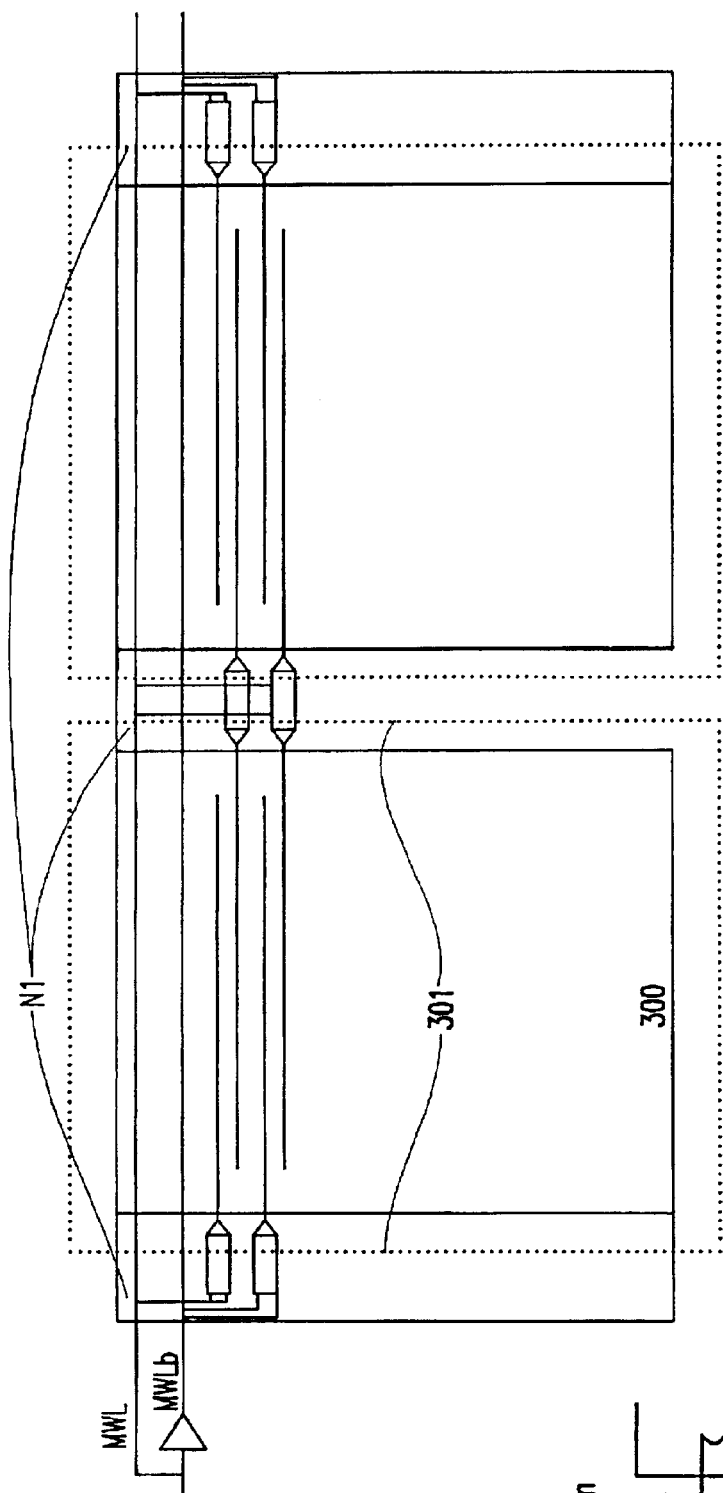
FIG. 3 is a layout showing a memory sub-array with local NMOS drivers according to the present invention.

Again, it is noted that the invention places the boost device N1 adjacent to the memory cell array. For a hierarchical wordline architecture, as shown in FIG. 3, the boost device N1 can be placed right next to the sub-array 300. The reason for this is to include an XA implant mask 301 (e.g., existing array NFET implant) to cover the boost device, which replaces the XN implant (e.g., to support NFET implant). The XA implant is designed for a DRAM array cell, which has a stringent leakage current requirement on the order of fA for retention time considerations.

In contrast, the XN implant (e.g., typically used for higher performance devices such as support devices, and typically using Arsenic having a concentration of about $1 \times 10^{14}$ to about $1 \times 10^{15}$ dopant ions per $cm^3$) is typically designed to achieve low sheet resistance and shallow junctions in order to achieve high performance for the peripheral NFET devices. Due to the different requirements for array and core/peripheral devices, the XA implant dose is typically lower than that used for the XN implant by 1.0 to 2.0 orders of magnitude. The resulting XA junctions are much more graded than NFET junctions, and therefore provide better snapback susceptibility.

Further, the support NFET typically receives an angled halo (e.g., the shape of the final formation of the implant in order to improve the short-channel effect for high performance considerations. The high dose p+ halo implant degrades the junction leakage and the junction breakdown voltage for the support NFET junctions because of a much higher local field.

Based on these two factors, the support device junction (e.g., made with XN implantation) has a breakdown voltage of approximately 7V, while for the array junction (e.g., made with XA implantation) a breakdown voltage is more than 10V. Therefore, by using an XA mask instead of an XN mask, the invention overcomes the problem of high junction leakage current and snapback susceptibility associated with the conventional design of a NFET word line (WL) driver circuit.

Overcoming the Reliability Issues of the Conventional Structures

Referring again to the circuit diagram in FIG. 1B, at burn-in and testing, the Vg, Vd and Vs (e.g., voltages at gate, drain and source) of an exemplary conventional N2 driver circuit are, 4.45V, 7.1V, and 4.45V, respectively. The leak induced threshold shift (LITS) effect due to substrate injection causes the Vt (e.g., threshold voltage) of the device to increase by about 30 to 40 mV due to the hot carrier effect.

During boosting, when the drain of the pull-up device 20 rises from 0V to Vpp, the hot electron trapping at the drain side will cause asymmetrical local Vt variations, which further increases the channel (e.g., between source and drain) resistance. The hot electron problem can be reduced by using a device with a channel length longer than the minimum channel length (e.g., longer than that required by the ground/design rule for the device).

Compared to a NMOS pull-up device (as shown in FIG. 1B) as used in the conventional methods and structures, the preferred embodiment of the invention described above and shown in FIGS. 2A–2D, significantly reduces the effects of this problem.

Further, in view of the gate stress of the device, since the gate oxide will never experience more than 2.5V of stress at any moment during normal NMOS operation. Therefore, there will be no significant concern on gate oxide breakdown. On the contrary, for the conventional CMOS driver, the gate oxide will experience a full Vpp stress.

Referring to burn-in data from an exemplary memory device of the assignee's, the gate oxide is 62A, and the maximum on-chip driver (OCD) stress is 3.8V (e.g., for this case, the stress voltage will be 2.5×1.5=3.75V, or 1.5 times of the Vdd voltage). Therefore, the exemplary memory device's OCD gate oxide passes the burn-in test and a 2.5V stress across the gate will not be a concern at burn-in. In comparison, a conventional CMOS device will experience 4.95V (or 3.3V×1.5=4.95V, or 1.5 times of the Vpp voltage) which is a problem.

Figure 4:
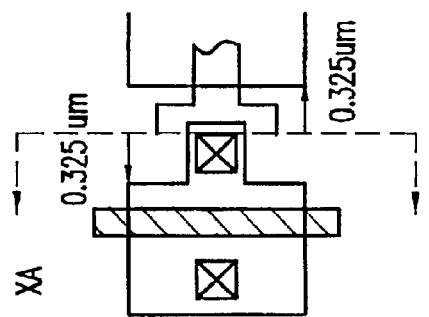
FIG. 4 illustrate the detailed layout at the border of the wordline driver.
Figure 5:
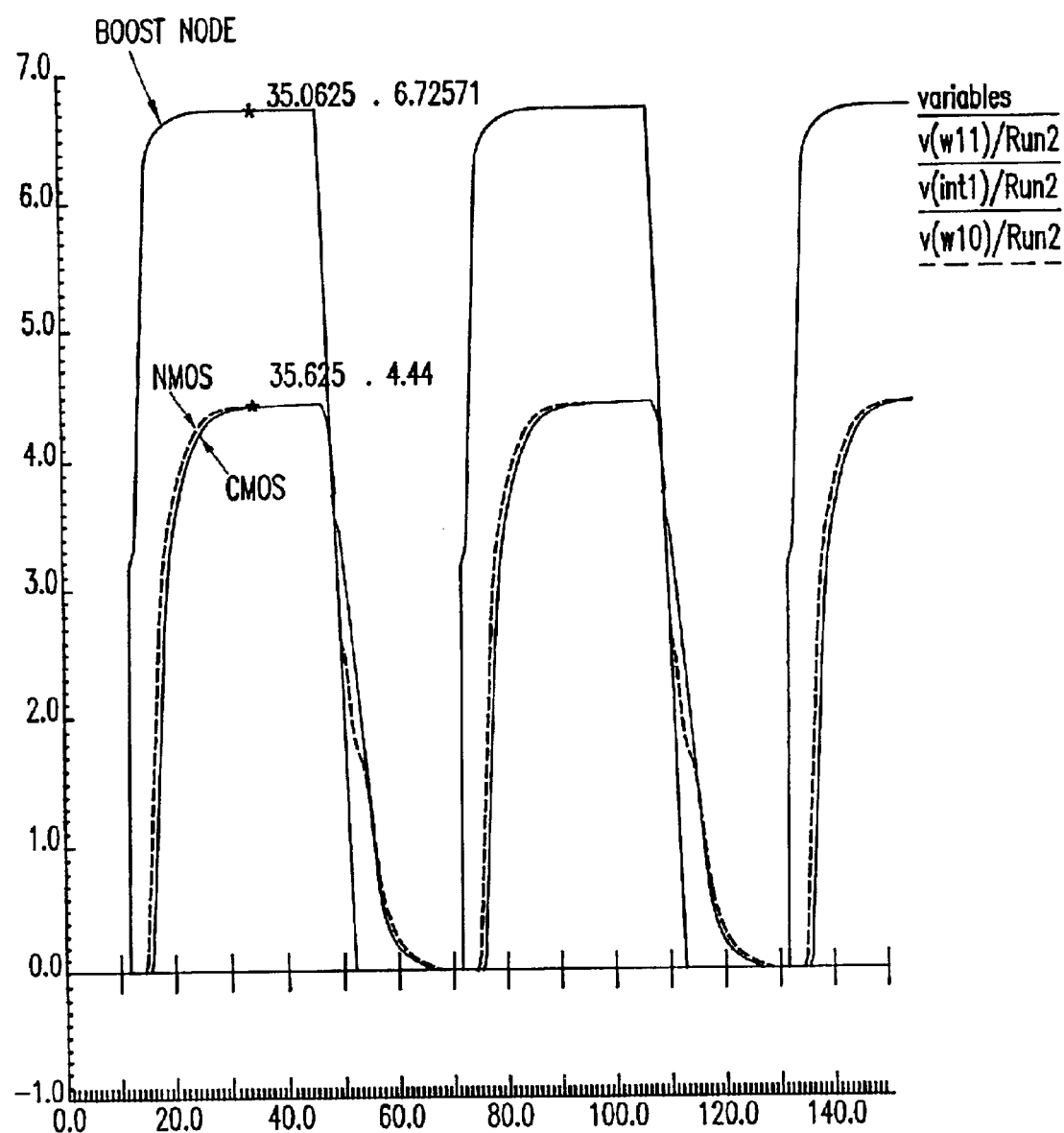
FIG. 5 shows the simulated waveform for the conventional CMOS wordline driver and that of the NMOS driver according to the present invention.

In the conventional method of fabricating a NMOS driver circuit, the CS is formed on the junction to connect to the gate. For 175 nm design/ground rules, this means that about 150 nm space of the contact drain (CD) to a gate conductor (GC)+200 nm CD size+150 nm CD to an edge of XA (as shown in FIG. 4)=500 nm distance to the STI from the edge of the gate.

When the self-aligned contact bitline (CB) is used, as in the invention, the distance can be reduced to the minimum (e.g., 150 nm or 175 nm) design rule by reducing the boost node junction dimension. This saves an additional 325 nm to 350 nm in the X direction.

Thus, the overall area loss required for XA alignment tolerance can be essentially recovered.

As described in the process flow for the NFET WL driver, both source and drain sides of a boost device N1 will have a self-aligned CB outdiffusion. A typical (conventional)

array device will only have CB outdiffusion on the bitline side. The outdiffusion from the highly doped polysilicon studs reduces the contact resistance of the boost device N1, and therefore enhances the performance of the device.

While the invention has been described in terms of a preferred embodiment, those skilled in the art will recognize that the invention can be practiced with modification within the spirit and scope of the appended claims.

What is claimed is:

1. A method of forming an N-channel metal oxide semiconductor (NMOS) driver circuit, comprising:
   forming a boost gate stack on a substrate, said boost gate stack having a source and drain formed by a low concentration N-type implantation; and
   coupling an N-driver to said boost gate stack.

2. The method according to claim 1, wherein said low concentration N-type implantation comprises no more that about $1\times10^{14}$ dopant ions per $cm^3$.

3. The method according to claim 1, wherein said low concentration N-type implantation comprises about $1\times10^{14}$ dopant ions per $cm^3$ to $1\times10^{14}$ dopant ions per $cm^3$.

4. The method according to claim 1, wherein said low concentration N-type implantation comprises one of phosphorus ions and boron ions.

5. A method according to claim 1, further comprising:
   forming a contacts adjacent sides of said boost gate stack for coupling said boost gate stack to said N-driver.

6. The method according to claim 5, wherein said boost gate stack is adjacent to a memory array, said low concentration N-type implantation comprising a memory array implantation.

7. The method according to claim 1, wherein said low concentration N-type implantation improves a reliability of said driver circuit by increasing a junction breakdown voltage arid lowering a contact resistance thereof.

8. The method according to claim 5, wherein said contacts comprise memory array bitline contacts.

9. The method according to claim 8, wherein said bitline contacts comprise polysilicon.

10. The method according to claim 9, wherein said bitline contacts comprise N-type doped polysilicon contacts, and the dopants are annealed and driven into said substrate to reduce the contact resistance.

11. The according to claim 1, wherein contacts are adjacent first and second sides of said boost gate stack.

12. The method according to claim 1, wherein said boost gate stack forms a boost device, said boost device having a channel length which is greater than a minimum channel length, said minimum channel length being a lithographically patternable feature size.

13. The method of forming an NMOS driver circuit according to claim 1, further comprising:
   forming a main wordline driver coupled to a plurality of sub-array drivers, each of said plurality of sub-array divers coupled to a corresponding boost gate stack.

14. The method according to claim 13, wherein a boost node of each boost gate stack is connected to a corresponding gate of said sub-array drivers.

15. The method according to claim 14, wherein a distance from an edge of said low concentration N-type implantation to an N diffusion area of a device junction is a minimum ground rule, and
   wherein a distance from an edge of said low concentration N-type implantation to an edge of an adjacent pull-up device is also a minimum ground rule.

16. The method according to claim 1, wherein said contacts comprise doped polysilicon contacts, and wherein said doped polysilicon contacts and said source and drain are self-aligned to the boost gate stack.

17. The method according to claim 10, wherein said doped polysilicon contacts form a self-aligned junction with said boost gate stack.

18. A method of forming an N-channel metal oxide semiconductor (NMOS) driver circuit, comprising:
   forming a boost gate stack on a substrate adjacent to a memory array;
   using a low-concentration N-type implantation to form a source and drain in said substrate for said boost gate stack; and
   coupling an N-driver to said boost gate stack.

19. The method according to claim 18, further comprising:
   forming contacts adjacent said gate stack.

20. A method of fabricating an N-channel metal oxide semiconductor (NMOS) driver circuit, comprising:
   forming a shallow trench isolation (STI) and a gate on a substrate, said gate forming a portion of a boost device for the driver circuit;
   forming a source and a drain for said boost device by a low concentration N-type implantation;
   depositing a layer of dielectric adjacent said boost device;
   patterning said dielectric layer;
   forming contacts in said patterned area of said dielectric layer;
   annealing said contacts; and
   connecting a boost node of said boost device to a gate of a sub-array device.

21. The method as claims in claim 20, wherein said sub-array device is adjacent to and contacts said boost device.

22. A method as claims in claim 20, wherein said contacts comprise self-aligned contacts.

23. The method as claims in claim 20, wherein said boost device has a channel length which is greater than a minimum channel length as determined by a design rule.

24. The method as claimed in claim 21, wherein said sub-array device has a channel length which is greater than a minimum channel length as determined by a design rule.

25. The method as claimed in claim 20, wherein a node of said boost device is connected to a gate of said sub-array device.

* * * * *